US011854601B2

(12) United States Patent
Nakai et al.

(10) Patent No.: US 11,854,601 B2
(45) Date of Patent: Dec. 26, 2023

(54) APPARATUSES, SYSTEMS, AND METHODS FOR READ CLOCK TIMING ALIGNMENT IN STACKED MEMORY DEVICES

(71) Applicant: MICRON TECHNOLOGY, INC., Boise, ID (US)

(72) Inventors: Kiyoshi Nakai, Kanagawa (JP); Seiji Narui, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 73 days.

(21) Appl. No.: 17/563,878

(22) Filed: Dec. 28, 2021

(65) Prior Publication Data
US 2023/0206985 A1 Jun. 29, 2023

(51) Int. Cl.
*G11C 11/4076* (2006.01)
*H01L 25/065* (2023.01)
*G11C 11/4096* (2006.01)

(52) U.S. Cl.
CPC ...... *G11C 11/4076* (2013.01); *G11C 11/4096* (2013.01); *H01L 25/0657* (2013.01); *H01L 2225/06541* (2013.01)

(58) Field of Classification Search
CPC . G11C 11/4076; G11C 11/4096; G11C 5/025; G11C 2207/107; G11C 5/063; G11C 7/1066; G11C 7/222; G11C 7/227; G11C 5/04; H01L 25/0657; H01L 2225/06541; H01L 2225/06513
USPC .................................................. 365/189.15
See application file for complete search history.

(56) References Cited

U.S. PATENT DOCUMENTS

| 2012/0194248 | A1 | 8/2012 | Magee et al. |
| 2019/0303042 | A1 | 10/2019 | Kim et al. |
| 2021/0134336 | A1* | 5/2021 | Na .................. G11C 29/028 |
| 2022/0083260 | A1* | 3/2022 | Lee ................. G06F 3/0679 |

FOREIGN PATENT DOCUMENTS

CN 111312307 A * 6/2020 ......... G11C 11/4076

OTHER PUBLICATIONS

U.S. Appl. No. 18/047,950, filed Oct. 19, 2022 titled, "Apparatuses, Systems, and Methods for Data Timing Alignment With Fastalignment Mode"; pp. all pages of application as filed.
U.S. Appl. No. 17/563,863 titled "Apparatuses, Systems, and Methods for Data Timing Alignment in Stacked Memory" filed Dec. 28, 2021, pp. all pages of application as filed.

* cited by examiner

*Primary Examiner* — Fernando Hidalgo
(74) *Attorney, Agent, or Firm* — Dorsey & Whitney LLP

(57) ABSTRACT

Apparatuses, systems, and methods for read clock timing alignment in a stacked memory. An interface die provides a read clock to a core die. The core die includes a serializer which generates data with timing based on the read clock and an adjustable delay circuit which provides a delayed read clock back to the interface die. The interface die outputs the data with timing based on the delayed read clock received from the core die. In this way, the read clock passes along a return clock path from the interface die, through a delay circuit of the core die and back to the interface die before controlling data output timing. Each core die may adjust the timing of the delay of the read clock in order to better align the read clock with the timing of data provided from that die.

18 Claims, 7 Drawing Sheets

APPARATUSES, SYSTEMS, AND METHODS FOR READ CLOCK TIMING ALIGNMENT IN STACKED MEMORY DEVICES

BACKGROUND

This disclosure relates generally to semiconductor devices, such as semiconductor memory devices. A memory device may be a stacked memory device, in which a number of core dies, each containing a memory array are stacked on top of an interface die. The interface die may have terminals which connect to one or more external devices. The interface die may communicate with the core dies to perform various operations, such as read or write operations to the memory arrays in one or more of the core dies.

The core dies and interface die may be coupled by through silicon vias (TSVs). It may take time for information such as commands and/or data to propagate along the TSVs between the interface die and the core die. Since it may take different amounts of time to pass information to different core dice in the stack, data aligners may be used to add delays to ensure that data from different core dice is aligned in time when it arrives at the interface die.

DETAILED DESCRIPTION

Figure 1:
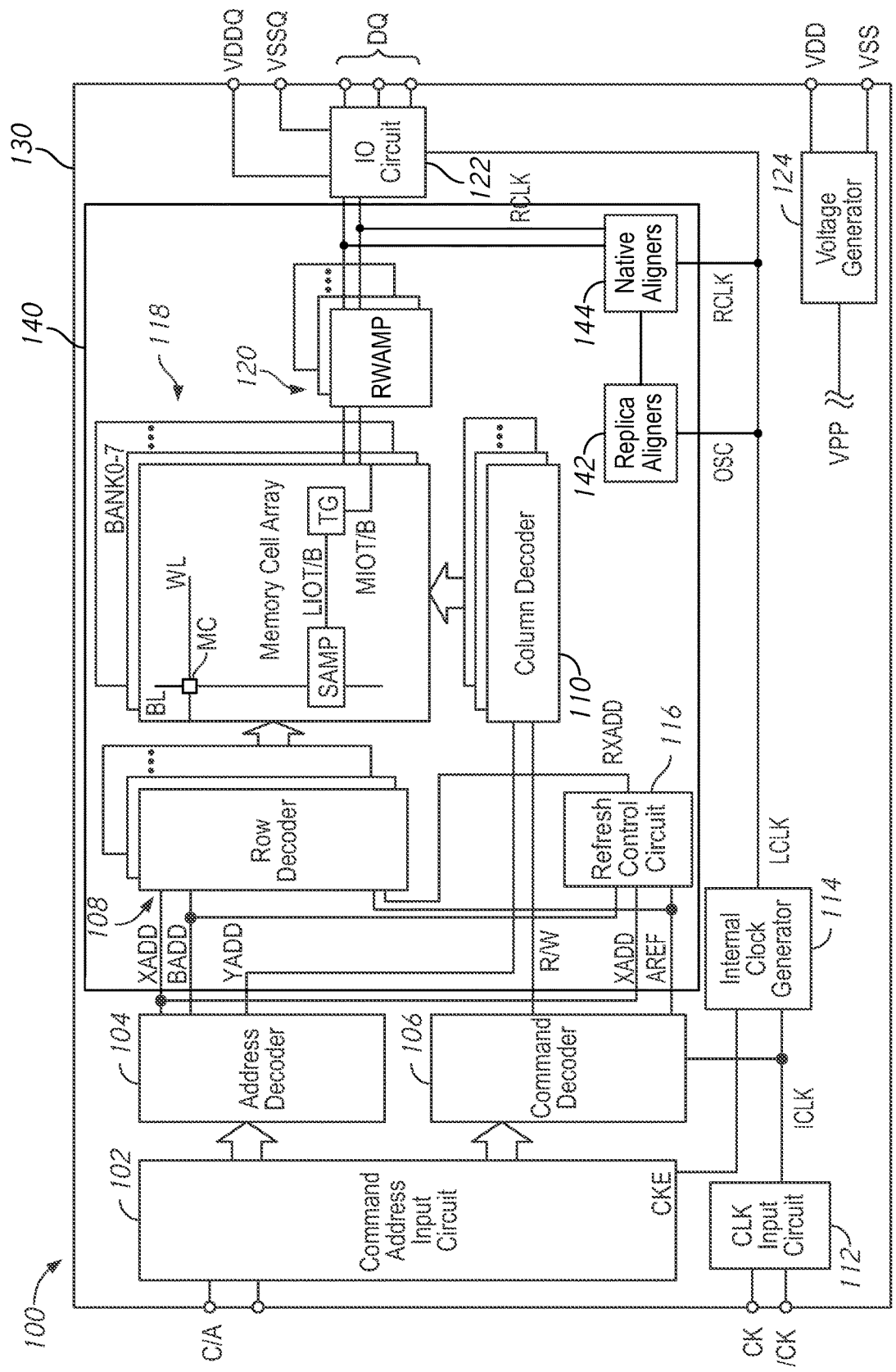
FIG. 1 is a block diagram of a semiconductor device according some embodiments of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

A memory device may include a number of core dice, each including a memory array, stacked on an interface die, which communicates between external devices and the core dice. Each memory array which has a number of memory cells, each located at the intersection of a word line (row) and digit line (column). During an access operation such as a read or write operation, the interface die may receive a command and addresses which may specify memory cell(s) in one or more of the core dice. It may be important to align the timing of the data passing between the interface and core dice so that information reaches (and/or is received from) a given core die with predictable timing. Information should reach each core die (or be received from) each core die with approximately the same timing (e.g., timing which is within a tolerance of each other). However, since ach core die is a different distance from the interface die it make different amounts of time for information to pass between different core dies and the interface. To facilitate this and achieve timing alignment, alignment circuits may be used to impose delays. Different alignment circuits may be used in read and write paths of the device (e.g., there may be a read alignment circuit and a write alignment circuit). The core and interface dies may have a native path in which data and commands are transmitted, and a replica path designed to mimic the delays along the native path and used to determine a timing for alignment circuits in the native path.

A clock signal is used to govern access operations. For example, a read clock may control the timing of read operations. The read clock is provided by the interface die to one or more core dice. Those core dice provide read data with timing based on read clock. A data latch in the interface die latches data received from the core die with timing based on the read clock. The read clock should be aligned with the timing of data transmitted from the different core dice such that the data latch is synchronized with the data provided by the core dice. In a conventional memory device, the read clock is provided to the core dice and also to a delay circuit within the interface die. The delay circuit in the interface die adds a configurable amount of delay before the read clock reaches the data latch. However, this may create problems, as the delay of the read clock may fail to take into account timing differences between different slices (e.g., different core dice).

The present disclosure is drawn to apparatuses, systems, and methods for read clock timing alignment in stacked memory devices. In an example memory device of the present disclosure, an interface die receives a read clock, and then provides the read clock to all of the core dice (e.g., slice). Each core die includes a delay circuit which delays the read clock, and provides the delayed read clock back to the interface die. The data latch then uses the delayed read clock received from the core die to control a timing at which data from that core die is captured. Since the read clock passes through the core die before returning to the data latch, the read clock may include delays (e.g., propagation delays, temperature delays, etc.) specific to that core die.

FIG. 1 is a block diagram of a semiconductor device according an embodiment of the disclosure. The semiconductor device 100 may be a semiconductor memory device, such as a DRAM device. The DRAM device may include an interface die and a plurality of core dice which are stacked on the interface die. In the example diagram of FIG. 1, certain components are shown located on an interface die 130, while other components are shown as part of each of the core dice 140. For the sake of clarity, only a single core die 140 and its components are shown, however, there may be multiple core die (e.g., 2, 4, 6, 8, 16, or more) each with similar components to each other. The example device 100 of FIG. 1 shows a particular arrangement of components between the interface die 130 and core die 140, however other arrangements may be used in other embodiments (e.g., the refresh control circuit 116 may be on the interface die 130 in some embodiments). For the sake of illustration, the core die 140 is drawn as a box which is smaller than the interface die 130, however the core die 140 and interface 130 may have any size relationship to each other. For example, the core die and interface die may be approximately the same size.

The semiconductor device 100 includes a memory array 118 on each of the core dice 140. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BL, and a plurality of memory cells MC arranged at intersections of the plurality of word lines WL and the plurality of bit line BL. The selection of the word line WL is performed by a row decoder 108 and the selection of the bit lines BL is performed by a column decoder 110, each of which may also be located on each of the core dice. In the embodiment of FIG. 1, the row decoder 108 includes a respective row decoder for each memory bank and the column decoder 110 includes a respective column decoder for each memory bank. The bit lines BL are coupled to a respective sense amplifier (SAMP) of the memory array 118. Read data from the bit line BL is amplified by the sense amplifier SAW, and transferred to read/write amplifiers 120 over complementary local data lines (LIOT/B), transfer gate (TG), and complementary main data lines (MIOT/B) which are coupled to a read/write amplifier (RWAMP) 120. Conversely, write data outputted from the RWAMP circuit 120 is transferred to the sense amplifier SAMP over the complementary main data lines MIOT/B, the transfer gate TG, and the complementary local data lines LIOT/B, and written in the memory cell MC coupled to the bit line BL.

The semiconductor device 100 may employ a plurality of external terminals located on the interface die 130 that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ.

The clock terminals on the interface die 130 are supplied with external clocks CK and /CK that are provided to an input circuit 112. The external clocks may be complementary. The input circuit 112 generates an internal clock ICLK based on the CK and /CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The internal clocks LCLK may include a read clock (RCLK) which is used to control the timing of read operations, and write clock (WCLK) which is used to control the timing of write operations. The internal clocks LCLK may be passed both to the I/O circuits 122 and also to internal components of the core dice 140 such as the RWAMP 120. Different ones of the core dice 140 may have different amounts of time lag (e.g., due to different temperatures of the different core dice, different distances from the interface die 130 etc.). Each of the core dice 144 may have aligners along read and write native paths 144. The aligners include one or more delay circuits which may add a configurable about of delay time to the signals in the core die 140. The core die 140 may also include a replica path 142, which may be used to measure the amount of delay in that die. The replica path may also include delay circuits which may be adjusted to determine a proper length of delay. In some embodiments, the interface die 130 also includes replica aligners. The replica aligners on the interface die 130 may act as the primary aligners during timing alignment, and the aligners 142 and 144 of the core dice 130 may act as secondary aligners. The replica aligners on the interface die 130 may include various control circuits such as a state machine to operate an alignment process. Information about the delays in the replica path may be used to adjust delays both in the native path in the aligner circuit(s) of the interface die (e.g., in the internal clock generator 114). The details of aligning the timing of the core and interface die will be described in more detail herein.

For the sake of brevity, only details related to the path of the read clock will be discussed in detail herein. However it should be understood that the write clock WILK may also have its own aligners and path (not shown). The internal clock generator provides a read clock RCLK, and an oscillator signal. The oscillator signal may be used by a replica path 142 to determine an amount of delay to apply in a native read path aligner 144 for the read clock. The read clock RCLK is provided from the interface die 130 to the native aligners 144 of the core die 140, which apply a configurable amount of delay based on the replica aligners 142. The delayed read clock is provided to both the RWAMPs to control when data is provided, and also to a data latch in the 10 circuit 122 of the interface die 130. The data provided by the RWAMP 120 of the core die 140 is received by the IO circuit 122 with timing based on the delayed RCLK received from the native aligners 144.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When a read command is received, and a bank address, a row address and a column address are timely supplied with the read command, read data is read from memory cells in the memory array 118 corresponding to the row address and column address. The read command is received by the command decoder 106, which provides internal commands so that read data from the memory array 118 is provided to the ECC control circuit 120. The read command may also cause one or more parity bits associated with the read data to be provided along the MIOT/B to the ECC control circuit 120. The ECC control circuit 120 may use the parity bits to determine if the read data includes any errors, and if any errors are detected, may correct them to generate corrected read data (e.g., by changing a state of the identified bit(s) which are in error). The corrected read data is output to outside the device 100 from the data terminals DQ via the input/output circuit 122.

The device 100 may receive an access command which is a write command. When the write command is received, and a bank address, a row address and a column address are timely supplied with the write command, and write data is supplied through the DQ terminals to the ECC control circuit 120. The write data supplied to the data terminals DQ is written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the ECC control circuit 120. The ECC control circuit 120 may generate a number of parity bits based on the write data, and the write data and the parity bits may be provided to the memory array 118 to be written into the memory cells MC.

The device 100 may also receive commands causing it to carry out one or more refresh operations as part of a self-refresh mode. In some embodiments, the self-refresh mode command may be externally issued to the memory device 100. In some embodiments, the self-refresh mode command may be periodically generated by a component of the device. In some embodiments, when an external signal indicates a self-refresh entry command, the refresh signal AREF may also be activated. The refresh signal AREF may be a pulse signal which is activated when the command decoder 106 receives a signal which indicates entry to the self-refresh mode. The refresh signal AREF may be activated once immediately after command input, and thereafter may be cyclically activated at desired internal timing. The refresh signal AREF may be used to control the timing of refresh operations during the self-refresh mode. Thus, refresh operations may continue automatically. A self-refresh exit command may cause the automatic activation of the refresh signal AREF to stop and return to an IDLE state. The refresh signal AREF is supplied to the refresh control circuit 116. The refresh control circuit 116 supplies a refresh row address RXADD to the row decoder 108, which may refresh one or more wordlines WL indicated by the refresh row address RXADD.

The power supply terminals are supplied with power supply potentials VDD and VSS. The power supply potentials VDD and VSS are supplied to an internal voltage generator circuit 124. The internal voltage generator circuit 124 generates various internal potentials such as VPP, VOD, VARY, VPERI, and the like based on the power supply potentials VDD and VSS supplied to the power supply terminals.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
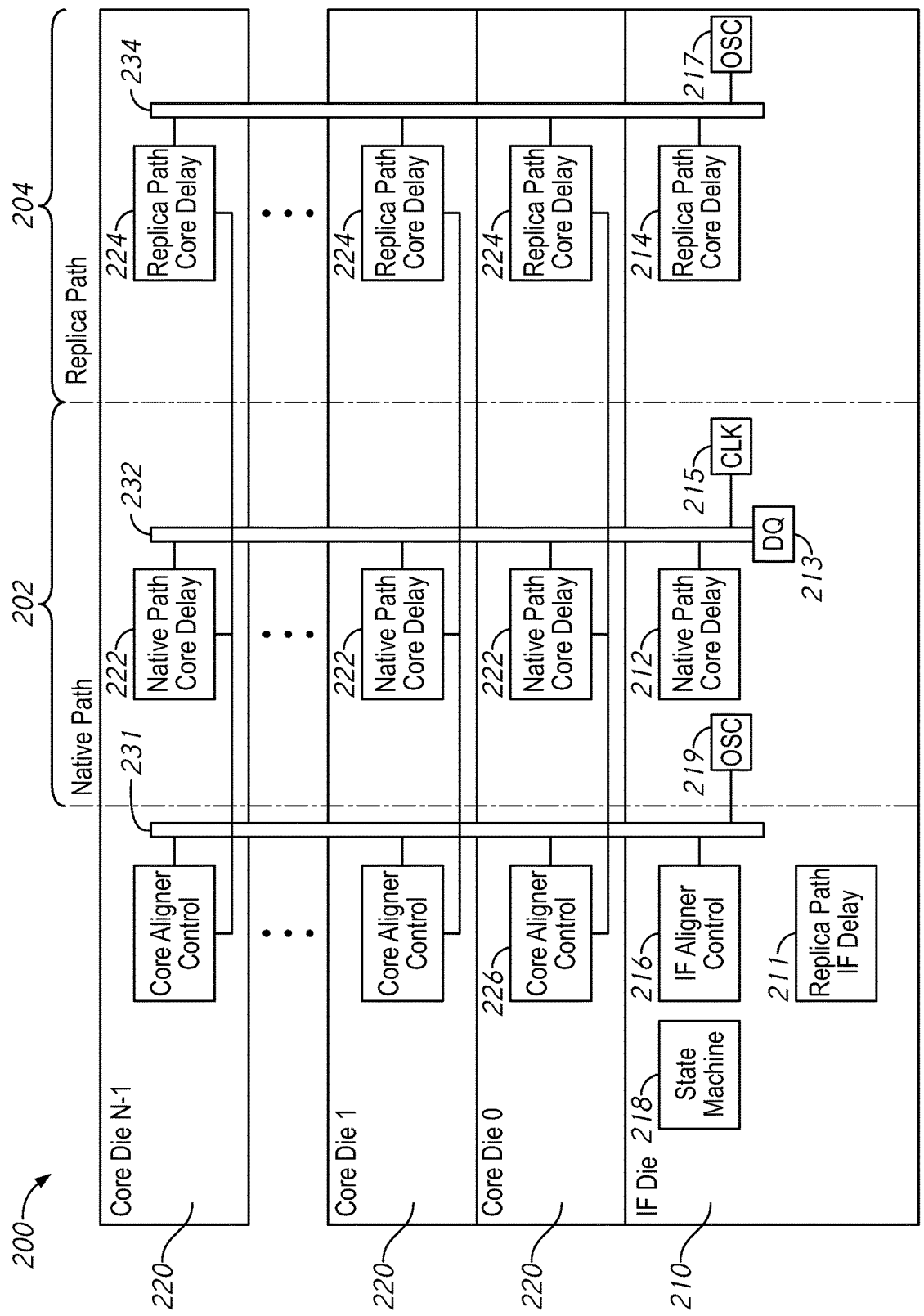
FIG. 2 is a block diagram of a memory device according to some embodiments of the present disclosure.

FIG. 2 is a block diagram of a memory device according to some embodiments of the present disclosure. The memory device 200 may, in some embodiments, represent a cross sectional view of a memory device such as the device 100 of FIG. 1. The memory device 200 includes an interface (IF) die 210, and a number of core dice 220 which are stacked on the interface die 210. Here the core dice 220 are labelled core die 0 through core die N-1 for a total of N core dice.

The interface die 210 may have a number of terminals to couple the device 200 to external devices. For example, the interface die 210 may include terminals such as clock terminals, power terminals, data terminals DQ 213, command terminals, etc. The core dice 220 may be coupled to the interface die 210 by one or more through silicon vias (TSVs) which may penetrate the stack and carry commands, signals, and/or data between the core dice 220 and the interface die 210. In FIG. 2, three sets of TSVs are shown, control path TSV 231, native path TSVs 232, and replica path TSVs 234. The TSVs 231, 232 and 234 include one or more signal lines which connect the different dice of the device 200 to each other. While the control path TSVs 231, native path TSVs 232 and replica path TSVs 234 are shown separately, in some embodiments, certain signal lines may be shared between the two TSV groups.

As may be seen, dice which are higher in stack (e.g., Core Die N-1) can be further from the interface die 210 than dice which closer (e.g., Core Die 0). In addition, different core dice 220 may have different temperatures, manufacturing variations etc which may also adjust the travel time of information such as signals and data between the core die 220 and the interface die 210. There may thus be different propagation times between the interface die 210 and different ones of the core dice 220. To prevent misalignment of signals and/or data being conveyed in the device 200, aligner circuits may be used to provide adjustable delays along native signal paths 202 in the core dice 220 and interface die 210. These delays may be adjusted based on measured signal alignment along a replica path 204, which may include circuits meant to mimic the timing along a native path 202.

The native path 202 may include native path TSVs 232 which convey information (e.g., signals such as commands and clock signals and data) between the memory arrays of the core dice 220 and the interface die 210. The replica path 204 may include replica path TSVs 234 and other circuits which are meant to mimic an amount of time it takes signals and data to propagate along the native path 202. Both the native path 202 and the replica path 204 may also include variable delay circuits which may be adjusted to align signal and data propagation time between the different core dice 220. For example, the native path 202 includes native path delay circuits 222 in the core dice 220 and native path delay circuits 212 in the IF die 210, while the replica path 204 includes replica path delay circuits 224 in the core dice 220 and replica path delay circuits 214 in the IF die 210. The interface die 210 may also include additional replica delay circuits 211, which may aid in the alignment of the control circuits 216 and 226. For example, the replica path delay 211 may be compared to the replica path delay 214 to determine which is faster. The IF aligner control 216 may calculate and update delays based on the signals from the interface die 210 such as from oscillator 219, and then update the delays in the native path 202 and replica path 204.

Each of the delay circuits 211, 212, 222, 214, and 224 may include one or more variable delay circuits which may be adjusted based on a control circuit. An IF aligner control 216 may control adjustments in the delay circuits 212 and 214 of the die 210, while core aligner controls 226 may control adjustments in the delay circuits 222 and 224 of the core dice 220. For the sake of clarity, signal lines have been simplified and/or omitted in FIG. 2 which show how the aligner control circuits 216 and 226 are coupled to the delay circuits 212, 222, 214, and 224. Example couplings are described in more detail in FIGS. 3 and 4.

The control TSVs 231 may be used to convey information between the control circuits 216 and 226 and the state machine 218. For example the control TSVs 231 may be used to convey information such as signals which indicate which state the state machine 218 is in, identification info which indicates which of the core dice 220 is being adjusted, and/or other related signals.

As shown in the example of FIG. 2, the native path 202 includes data terminals DQ 213, which are coupled to memory arrays in the core dice 220 by the native path TSVs 232. The native path TSVs 232 also distribute clock signals from a clock circuit 215 (e.g., internal clock generator 114 of FIG. 1), which may generate internal clock signals based on an external clock (not shown). The clock signals provided by the clock circuit 215 may control the timing of operations between the interface die 210 and the core dice 220. The replica path 204 may include replica path TSVs 234 which provide an oscillator signal OSC from an oscillator circuit 217 of the interface die 210 to delay circuits 224 of the core dice 220. The oscillator signal may be passed through one or more delay circuits 214 and 224. The state machine 218 may adjust the delays in the delay circuits 214 and 224 of the replica path 204 and measure an alignment of the oscillator signal. Based on that values in the replica path 204 which bring alignment, the delay values in the native path 202 may also be adjusted. For example, the delay values may be matched between the replica and native paths.

In an example write operation, data may be provided at the DQ terminal 213 and then passed along the TSVs 232 to one or more selected ones of the core dice 220. The clock circuit 215 may provide a write clock, which may be adjusted by the native path interface delay to provide a delayed interface write clock. The delayed interface write clock may be used to determine the timing with which the data from the DQ pads 213 is provided along the TSVs 232 to the selected one(s) of the core dice 220. The write clock may also be passed up the TSVs 232 to the native path core delay circuits 222 in the selected one(s) of the core dice 220, which may provide core delayed write clock signal(s). The core delayed write clock signals may determine the timing with which the data along the TSVs 232 is received. Based on the propagation of the oscillator signal OSC from the oscillator circuit 217, the state machine 218 may adjust the delays in the native path 202 to ensure that the write data reaches the memory array in alignment with the write clock.

A state machine 218 in the interface die 210 operates control circuits 216 and 226 in the interface 210 and core dice 220 respectively. The control circuits 216 and 226 may adjust delays in replica paths 214 and 224 of their respective dies and measure the alignment of signals (e.g., measure a phase difference between signals). The state machine 218 may control which circuits and which delays are being adjusted and monitor the measured alignments. The delays set in the replica path 204 may also be applied to the alignment circuits 212 and 222 in the native path 202. Once the measured alignments are within tolerances, the delays may bring the device 200 into timing alignment. Each of the core dice 220 and the IF die 210 may have different delays from each other.

The state machine 218 may update the delay values as part of an ongoing process in the memory device 200. For example, the state machine 218 may use an initial set of states to establish delays in the interface aligner control circuit 216 and in each of the core aligner control circuits 226. After the initial states, the state machine 218 may operate a maintenance state which keeps the delays in alignment. To prevent unnecessary adjustment, the maintenance state may use averaging to determine when a delay value has shifted out of alignment. The state machine 218 may also define underflow and overflow limits. When one of these limits is exceeded, the state machine 218 may shift to a rapid alignment mode, including a state where the delay in the interface aligner control 216 is adjusted, followed by a process where the delays in the core aligner control circuits 226 in each of the core dice 220 is adjusted without averaging. Once the state machine 218 determines that the overflow/underflow conditions are no longer met, the state machine 218 may return to the maintenance state.

In some embodiments, the delays in the native path circuits 212 and 222 and in the replica path delay circuits 214 and 224 may be divided between a read path and a write path. For example, the delay circuits may each include one or more read path delay circuits and one or more write path delay circuits, each of which may have their own separate delay values. Similarly, the state machine 218 may have a first process for setting values in the read path and a second process for setting delay values in the write path.

Figure 3:
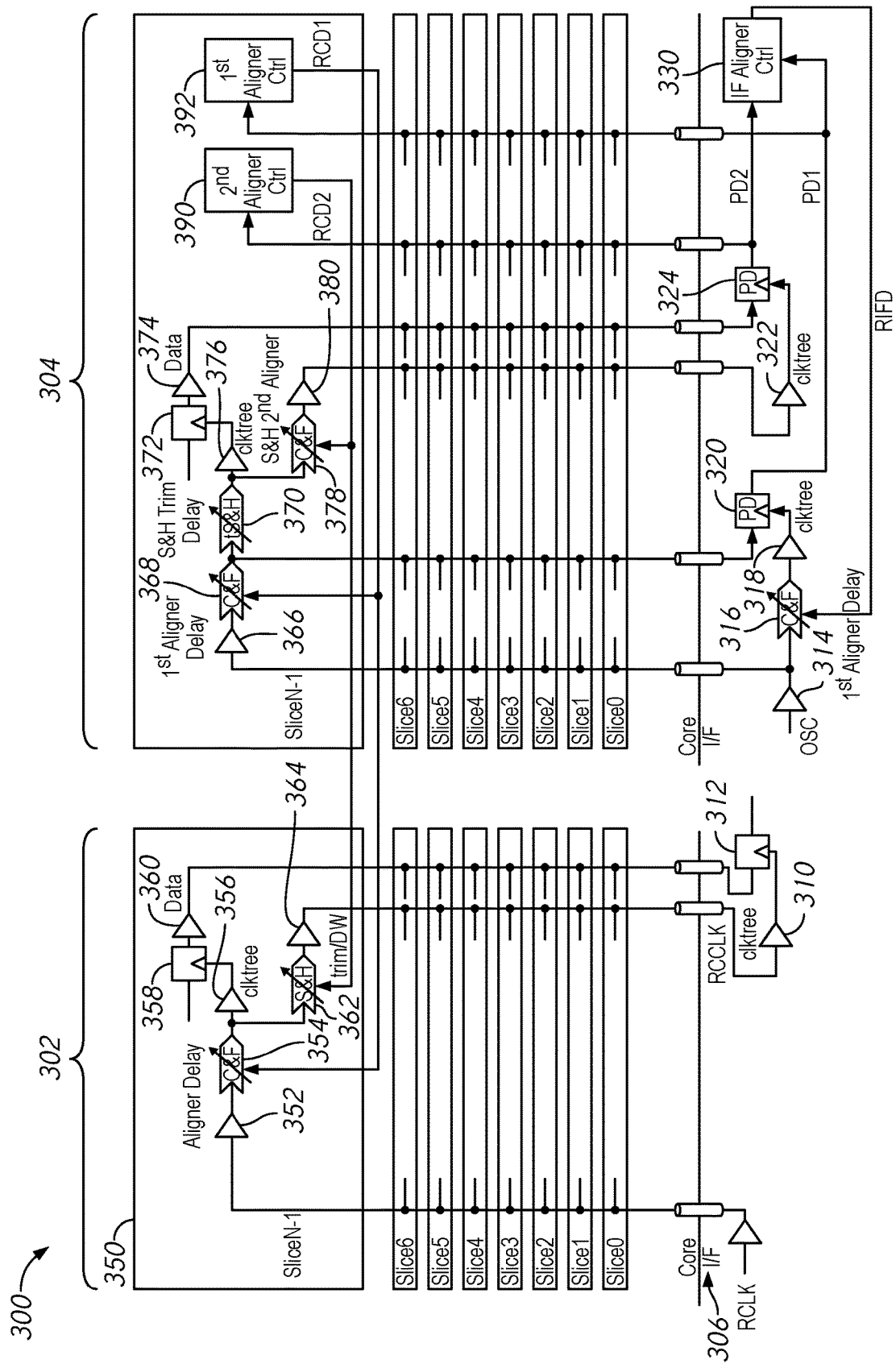
FIG. 3 is a schematic diagram of a read path according to some embodiments of the present disclosure.

FIG. 3 is a schematic diagram of a read path according to some embodiments of the present disclosure. The device 300 may be an implementation of the device 200 of FIG. 2 and/or 100 of FIG. 1. The device 300 includes an interface die 306 and a plurality of stacked core dice. In the example of FIG. 3, only a single core die 350 (core die Slice N-1) is described in detail. However each of the core dice may have similar components and operations to the described core die 350. The device 300 shows components used in the timing alignment of signals and data during a read operation. Some of the components shown in FIG. 3 may also be used in other operations (e.g., write operations). For example, the aligner control circuits 390 and 392 may be part of an aligner control circuit (e.g., 226 of FIG. 2) which manages delays in a write path. Similarly, the aligner control circuit 330 may be part of an aligner control circuit (e.g., 216 of FIG. 2) which manages delays in the write path.

The interface die 306 and core die 350 include a native path 302 and a replica path 304 (e.g., native path 202 and replica path 204 of FIG. 2). The native path is used to provide signals and data. In this case a read command is provided to the interface die 306 which passes the read command to the indicated core die 350 along a TSV path. The core die 350 retrieves the data from the memory array and provides the data back along a TSV path to an output latch or data latch 312 on the interface die 306, which can then provide the data to output terminals (e.g., DQ terminals) or other output circuitry. In addition to the native path 302, the core die 350 and IF die 306 also include a replica path 304, which include circuits which may be used to mimic and measure delay times which simulate those between the interface die 306 and core die 350 in the native path 302. Aligner control circuits 330, 390, and 392 may use measurements of the data alignment along the replica path 304 to set variable delays in the native path 302.

The native path 302 of the interface die 306 includes a buffer circuit 308 which receives a read clock signal RCLK as part of a read operation. The read clock RCLK may be used to time receipt of data retrieved from the core die 350, which may be indicated by an address. The buffer circuit 308 provides the read clock RCLK along a TSV stack to the core die 350. In the native path 302 of the core die 350, a buffer 352 receives the read clock RCLK and provides it to a first native delay circuit 354. The first native delay circuit 354 may provide a delayed read clock based on an adjustable amount of delay, controlled by the signal RCD1 provided by the first aligner control circuit 392. The first native delay circuit 354 may be a coarse and fine adjustment circuit. In a coarse and fine adjustment circuit different numbers of gates may be activated to adjust the delay. Some gates may have a relatively long delay time (coarse adjustment) while others may have a relatively short delay time. For example, each activated coarse gate may have about 10 times the delay of an activated fine gate. By controlling a number of coarse and fine gates which are active, the amount of delay in the first native delay circuit 354 may be controlled. A first aligner control circuit 392 provides a control signal RCD1 which determine a total delay time of the first native delay circuit 354 by determining how many (and which type) of gates are active. The control signal RCD1 may have a coarse portion which specifies a number of active coarse gates, and a fine portion which specifies a number of active fine gates.

The first native delay circuit 354 provides the delayed read clock to a clock tree 356 and a second native delay circuit 362. The clock tree 356 distributes the delayed read clock to various circuits of the memory. For clarity of illustration, only a single path of the clock tree 356 is shown, from the first native delay circuit 354 to a local latch 358. The local latch 358 may be part of a data serializer circuit, which receives data in parallel (e.g., from a memory array) and then converts it into a serial format with timing based on read clock received from the first aligner delay circuit 354. The clock tree 356 may distribute the signal to many other circuits of the core dice 350 (e.g., other local latches). The local latch 358 has an input terminal coupled to the memory array to receive data read from the memory array (not shown). The data may be provided based on commands received at the interface die 306 and passed to the core die (e.g., a read command, column, row, and bank address). The local latch 358 has a clock terminal coupled to the output of the clock tree 356. The local latch 358 latches the data read from the memory array with timing based on the delayed read clock which was delayed by the first native delay circuit 354 and distributed by the clock tree 356. The data in the local latch 358 is provided through a buffer circuit 360 through a TSV stack to an output latch 312.

The second native delay circuit 362 receives the delayed read clock from the first native delay circuit 354. The second native delay circuit 362 may also be a coarse and fine (C&F) type delay circuit with an adjustable amount of delay controlled by a signal RCD2 provided by the second aligner control circuit 390. Similar to the other C&F type delay circuits, the second native delay circuit 362 may receive a control signal (e.g., RCD2) which includes both coarse and fine delay values, which specify a number of coarse and fine gates to activate. The second native delay circuit 362 provides a delayed read clock RRCLK through a buffer 364 to a TSV stack after an amount of time determined by RCD2. The delayed read clock RRCLK is passed along the TSV stack back to the interface die 306, where a clock tree 310, analogous to the clock tree 356 of the core die 350, distributes the clock RRCLK to the output latch 312.

The output latch 312 has a data terminal coupled to a TSV stack which provides the data which was read from the memory array and stored in the local latch 358. The output latch 312 has a clock terminal which receives the delayed clock signal RRCLK from the clock tree 310. Although not shown in FIG. 3, the output latch 312 may provide the data to output circuits and/or DQ terminals (e.g., DQ terminals 213 of FIG. 2).

The replica path 304 may generally be similar to the native path 302 in order to mimic the delays of the signals RCLK and RRCLK and the data. In the replica path, the interface die 306 provides an oscillator signal OSC (e.g., from an oscillator circuit such as 217 of FIG. 2). The oscillator signal OSC may mimic a clock signal such as the read clock RCLK. The oscillator signal OSC is pass through a buffer circuit 314 (e.g., similar to buffer 308) through a TSV stack to the core die 350. The buffer 314 also provides the signal OSC to an interface delay circuit 316. The interface delay circuit 316 has a variable amount of delay which is determined by a control signal IFD provided by an interface aligner control circuit 330 in the interface die 306. The interface delay circuit 316 provides a delayed oscillator signal through a replica clock tree 318 to a first phase detector 320. The replica clock tree 318 may be a delay circuit which mimics a delay time along the clock tree 310 of the native path 302. Accordingly, the replica clock tree 318 may match a delay time it takes a signal to pass along the clock tree 310, but may not necessarily match the layout of the clock tree 310.

In the core die 350, a buffer circuit 366 passes the oscillator signal OSC from the interface die 306 to a first replica delay circuit 368. The first replica delay circuit 368 may be a coarse and fine delay circuit which mimics the behavior of the first native delay circuit 354, and which may be generally similar to the first native delay circuit 354. The first replica delay circuit 368 also has a variable amount of delay which is controlled by the signal RCD1 provided by the first aligner control circuit 392. The first replica delay circuit 368 provides a delayed oscillator signal along a TSV stack back to the first phase detector 320 in the interface die 306.

The first phase detector 320 measures a phase difference between the oscillator signal which was delayed by the interface delay circuit 316 and the delayed oscillator signal from the first replica delay circuit 368. The first phase detector 320 provides a measured phase difference signal PD1. The first aligner control circuit 392 and the interface aligner control circuit 330 use the measured phase difference signal PD1 to set the values of the signals RCD1 and IFD as explained in more detail herein.

The first replica delay circuit 368 also provides the delayed oscillator signal to a trim delay circuit 370 of the core die 350. The trim delay circuit 370 may have an adjustable amount of delay which is set to trim the operation of the replica path 304. For example, trim fuses may be used to set the delay of the trim delay circuit 370. The trim delay circuit 370 may be a set and hold delay circuit. The trim delay circuit 370 provides the delayed oscillator signal to a replica clock tree 376, which provides the signal to a local latch 372. The replica clock tree 376 is a delay circuit which has delay time which replicates (e.g., is substantially the same as) a delay time of the clock tree 356. The local latch 372 uses the delayed oscillator signal to clock data which is stored from the memory array and then provided through a buffer to the interface due 306. The replica clock tree 376, local latch 372, and buffer 374 may be analogous to the clock tree 356, local latch 358, and buffer 360 of the native path 302.

The trim delay circuit 370 provides the delayed oscillator signal to a second replica delay circuit 378. The second replica delay circuit 378 has a variable amount of delay controlled by the signal RCD2 from the second aligner control circuit 390. The second replica delay circuit 378 may be a coarse and fine adjustment circuit. The second replica delay circuit 378 provides the delayed oscillator signal through a buffer 380 back along a TSV stack to a replica clock tree 322 in the interface due 306. The replica clock tree 322 provides the delayed oscillator signal to a second phase detector 324. The replica clock tree 322, similar to the replica clock tree 318, may match a delay time of the clock tree 310. The second phase detector 324 also receives the data from the local latch 372 which was clocked by the oscillator signal delayed by the first replica delay circuit 368 (and the trim delay circuit 370). The phase detector 324 provides a signal PD2 based on a measured phase difference between the delayed clock oscillator signal and the data. The signal PD2 is used by the interface aligner control 330 (along with the signal PD1) to set a value of the interface delay IFD, and is used by the second aligner control circuit 390 to set a value of the control signal RCD2, as described in more detail herein.

The replica clock trees 376, 318, and 322 may each match a delay time it takes a signal to propagate along the corresponding clock tree (e.g., 356 for replica clock tree 376, and 310 for replica clock trees 318 and 322). The replica clock trees may be delay circuits and may not include branching paths.

Figure 4:
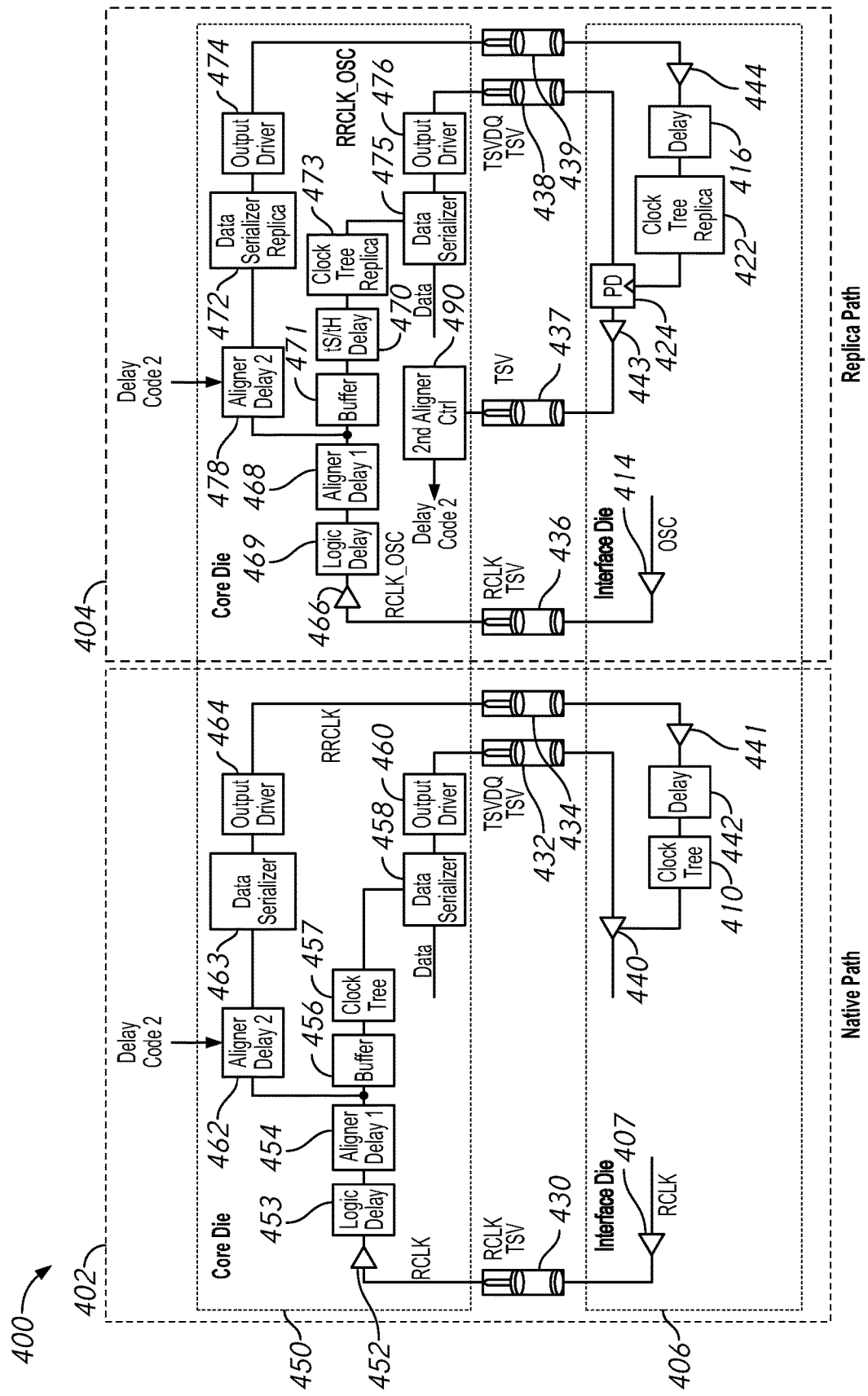
FIG. 4 is a block diagram of a read path according to some embodiments of the present disclosure.

FIG. 4 is a block diagram of a read path according to some embodiments of the present disclosure. The read path 400 may, in some embodiments, be included on the memory device 100 of FIG. 1 and/or 200 of FIG. 2. The read path 400 may be generally similar to the read path 300 of FIG. 3. While the read path 300 of FIG. 3 may show an example implementation of certain components, the read path 400 shows different functional elements along the read path 400.

The read path 400 includes a native path 402 (e.g., 202 of FIG. 2 and/or 302 of FIG. 3) and a replica path 404 (e.g., 204 of FIG. 2 and/or 304 of FIG. 3). The read path 400 passes from an internal die, which connects to external devices (e.g., a memory controller) and to one or more core dice 450 which include memory cells to store data. For the sake of brevity, only a single core die 450 is shown/described with respect to FIG. 4. Various through silicon vias (TSVs) 430-439 couple various signals and data between the core die 450 and the interface die 406.

In the native path 402, a read dock RCLK is provided from the interface die 406 along TSV 430 to the core die 450, where it is delayed by a delay circuit 455. The delayed clock signal RRCLK is provided back along TSV 434 to the interface die 406, where it is used to clock data received from the core die 450 along TSV 432.

The interface die 406 includes a clock buffer 407 which provides a read clock RCLK to the TSV 430. The buffer 407 may receive the read clock RCLK from an internal clock generator (e.g., 114 of FIG. 1), which in turn may base the read clock RCLK on an externally received clock signal. The TSV 430 provides the read dock to the core dice 450, where an input buffer 452 provides the read clock RCLK to a logic delay 453 and a first native aligner circuit 454 (e.g., 354 of FIG. 3). The logic delay 453 may represent delays inherent in the logic circuits of the core die 450. The first aligner circuit 454 may include a configurable amount of delay (e.g., set by a first aligner control circuit such as 392 of FIG. 3). For example, a first delay code (not shown in FIG. 4) may be used to set the amount of delay in the first aligner circuit 454.

The first aligner circuit 454 provides a delayed read clock to a buffer 456 and to a second native aligner circuit 462. The buffer 456 provides the read clock to a clock tree 457 which distributes the read clock to various components of the memory, such as to different latches (e.g., 358 of FIG. 3) of a data serializer 458. The data serializer 458 latches data (e.g., from a memory array such as 118 of FIG. 1) with timing based on the read clock. The data serializer may convert parallel data from the memory array into serialized data, based, at least in part, on the timing of the read clock. The serialized data is provided through an output driver 460 to a DQ TSV (TSVDQ) 432 which transmits the serialized data back to the interface die 406.

The second native aligner circuit 462 (e.g., second native aligner 362 of FIG. 3) of the core die 450 also receives the read clock signal delayed by the first native aligner circuit 454 and further delays the read clock. The second native aligner circuit 462 has a configurable amount of delay based on a second delay code Delay Code 2 (e.g., RCD2) provided by a second aligner control circuit 490 (e.g., 390 of FIG. 3). The second native aligner circuit 462 provides a delayed read clock to a data serializer replica 463. The data serializer replica 463 adds an additional amount of delay which replicates a delay added by the data serializer 458. The delayed read clock is provided through an output buffer 464 as a returned read clock RRCLK. The returned read clock RRCLK is provided along a TSV 434 to an input buffer 441 of the interface die 406.

In the interface die 406, the returned clock signal RRCLK received from the core die 450 is provided by the input buffer 441 to a delay circuit 442. The delay circuit 442 may add a fixed amount of delay, or a configurable amount of delay. The delay circuit 442 provides the clock RRCLK to a clock tree 410 (e.g., 310 of FIG. 3), which distributes the clock RRCLK to output circuits 440 (e.g., 340 of FIG. 3). The output circuits provide the serialized data to output terminals with timing based on the read clock RRCLK provided through the clock tree 410.

In this way, the read clock RCLK passes through the core die 450 before returning as the returned RRCLK, which has been delayed in the core die 450, back to the interface die 406. Since the configurable delay circuits 454 and 462 may have different delay times in each of the core dice 450, the returned read clock RRCLK may have a delay which is specific to the core die 450 that the serialized data is received from.

Turning to the replica path 404, the replica path 404 may be used to replicate an amount of delay in the native path 402, measure an alignment of the replica path 404, and set the configurable delays in both the replica path 404 and native path 402 to bring the timing of both paths into alignment. The components of the replica path 404 include many components meant to replicate the operation of the native path 402. For the sake of brevity, the operation of components along the replica path 404 similar to those of the native path 402 will not be described in detail again.

The replica path 404 of the interface die includes an oscillator signal OSC, which simulates the read clock RCLK. The signal OSC may be generated by an oscillator circuit (not shown) of the interface die 406. The oscillator signal OSC is provided through an output buffer 414 through a TSV 436 to an input buffer 466. The core die 450 may receive the oscillator signal as RCLK_OSC, and may use it to replicate the read clock RCLK of the native path 402. The input buffer 455 provides the signal RCLK_OSC to a logic delay 469 (which may replicate 453) and through that to a first aligner delay circuit 468 (which may replicate 454). The first replica aligner delay circuit 468 provides a delayed oscillator signal to a buffer 471 and to a second replica aligner delay circuit 478 (which replicates second native aligner delay circuit 462).

The second aligner delay circuit 478 delays RCLK_OSC by a configurable amount based on a second delay code provided by the second aligner control circuit 490. The delayed RCLK_OSC is provided through a data serializer replica 472 (e.g., 463) and output driver 474 (e.g., 464) as a return clock oscillator signal RRCLK_OSC to a return clock TSV 439. The first replica aligner delay 468 also provides the delayed RCLK_OSC to a buffer 471 which provides the oscillator signal through a set and hold delay circuit 470 (e.g., 370 of FIG. 3) to a clock tree replica 473 (e.g., 457). The set and hold delay circuit 470 may have a settable amount of delay, and may be used to trim the delay of the replica path 404 compared to the native path 402.

The replica clock tree 473 distributes RCLK_OSC to a data serializer 475 which serializes data with timing based on RCLK_OSC. The serialized data is provided through an output driver 476 to a TSVDQ 438 to a phase detector 424.

The return clock TSV 439 provides the delayed oscillator signal RCLK_OSC through an input buffer 444, delay circuit 416, and clock tree replica 422 of the interface die 406 to the phase detector 424. The phase detector 424 (e.g., 324 of FIG. 3) provides a signal based on a measured phase difference between the serialized data and the oscillator signal RCLK_OSC received from the core die 450. The signal from the phase detector 424 is provided along a TSV 437 back to the core die 450, where a second aligner control circuit 490 sets a value of a second delay code based on the signal from the phase detector 424. The second delay code in turn determines the amount of configurable delay in the second delay circuits 462 and 478.

In this way, in a manner analogous to the read clock of the native path 402, the oscillator RCLK_OSC passes from the interface die 406 to the core die 450, through a pair of configurable delay circuits 468 and 478 before returning to the interface die 406. In this way, the oscillator may have an amount of delay which is specific to each core die 450.

Figure 5:
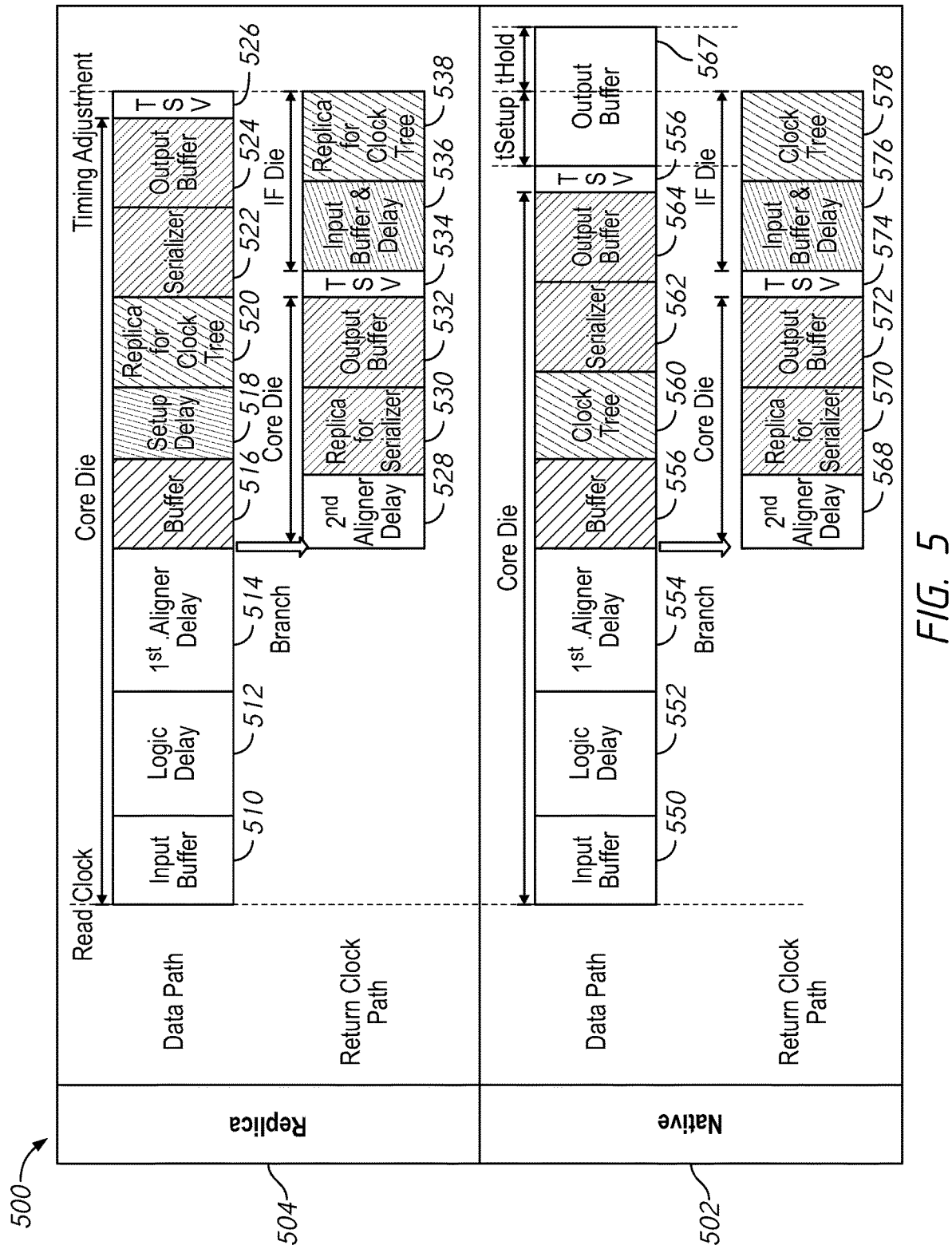
FIG. 5 is a chart representing example timing delays in a stacked memory according to some embodiments of the present disclosure.

FIG. 5 is a chart representing example timing delays in a stacked memory according to some embodiments of the present disclosure. The chart 500 includes blocks representing delay times in a replica path 504 and native path 502 of a stacked memory device. For example, the chart 500 may represent timing in the memory 100 of FIG. 1, 200 of FIG. 2, 300 of FIG. 3, and/or 400 of FIG. 4 in some example embodiments. In particular, the chart 500 shows delay times caused by components similar to those described with respect to FIG. 4. Reference will be made to the components of FIG. 4 to illustrate the physical components which may provide such delays.

In the chart 500, the width of different blocks is used to represent a delay caused by that component, with a longer delay represented by a wider box. The timings shown in FIG. 5 are for example only, and the widths of the boxes may be not be to scale.

The replica path 504 and native path 502 are split onto delays along a data path which tracks a clock signal provided from the interface die through the core died to a data serializer, and then tracks delays of the serialized data from the core die back to the interface die, and also a return clock path which tracks the clock signal as it passes through core die and then back to the interface die.

The native path 402 shows a delay caused by an input buffer 550 (e.g., 452), logic delay (e.g., 453), and first aligner delay (e.g., 454). After the first aligner delay, there is a branch between the data path and the return clock path, as the first aligner delay circuit 454 provides the delayed read clock to both a second aligner delay 462 (e.g., along the return clock path) and to a buffer 456 (and through that to the serializer 458).

Along the data path, after the first aligner delay 554, there are further delays from the buffer 556 (e.g., 456), clock tree 560 (e.g., 457), serializer 562 (e.g., 458), output buffer 564 (e.g., 460), TSV 556 (e.g., 432), and then the timing of a data window 567. The data window represents timing over which the data is present and may be captured by the output circuits.

Along the return clock path, there are delays provided by a second delay circuit 568 (e.g., 462), replica serializer 570 (e.g., 463), output buffer 572 (e.g., 464). TSV 574 (e.g., 434), input buffer 576 (e.g., 441 and 442), and clock tree 578 (e.g., 410).

Accordingly, following the timing of the clock path, there is a total amount of delay which ends with the end of the clock tree 578, which represents the signal RRCLK leaving the clock tree 410 and arriving at the output circuit 440. Following the data path, the data window 567 represents the time at which the data is valid for capture at the output circuit 440. Accordingly, as shown by the dotted lines, the timing is adjusted such that the timing of the return clock path ends within the data window such that the data may be validly captured. The first and second aligner delays 554 and 568 may be adjusted based on measurements from the replica path 504. In particular, the delays may be adjusted so that read clock RRCLK leaves the clock tree 578 roughly in the middle of the data window 567. An example ideal alignment may have the clock tree 578 end a timing tSetup after the beginning of the data window 567 and a time tHold before the end of the data window 567. The timings tSetup and tHold may represent timings set up in the tSh/tH delay circuit 470.

Regarding the replica path, the oscillator signal, which mimics the read clock is provided to input buffer 510 (e.g., 466), logic delay 512 (e.g., 469), and first aligner delay 514 (e.g., 468). After the aligner delay 468 the pathways branch. Along the data path after the first aligner delay 514, there is a buffer delay 516 (e.g., 471), setup delay 518 (e.g., 470), clock tree replica 520 (e.g., 473), data serializer 522 (e.g., 475), output buffer 524 (e.g., 476) and TSV 526 (e.g., 438). The end of the block for the TSV 526 indicates when the data is available at the phase detector 424, with the dotted line representing the time at which the data is latched by the phase detector 424 responsive to the end of the return clock path.

Along the clock return path, after the first aligner delay 514, there is a second aligner delay 528 (e.g., 478), replica for serializer 530 (e.g., 472), output buffer 532 (e.g., 474), TSV 534 (e.g., 439), input buffer and delay 536 (e.g., 416 and 422), and clock tree 538 (e.g., 422). The end of the clock tree block 538 represents when the returned read clock oscillator reaches the phase detector 424.

Based on the timing at which the phase detector provides a signal to the second aligner control 490, the timing of the second aligner delay 528 may be adjusted to ensure that the end of the clock tree 578 falls within the data window 567. For example, the timing may be adjusted such that the timing of the buffer 516 and setup delay 518 along the replica path 504 is approximately equal to the length of the second aligner delay 528/568 and the input buffer and delay 536/576.

Since as may be seen from FIG. 5, the 1$^{st}$ aligner delay affects both the data path and the return clock path, the second aligner delay 528/568 may be most useful for adjusting the timing of the return clock path relative to the timing of the data path.

Figure 6:
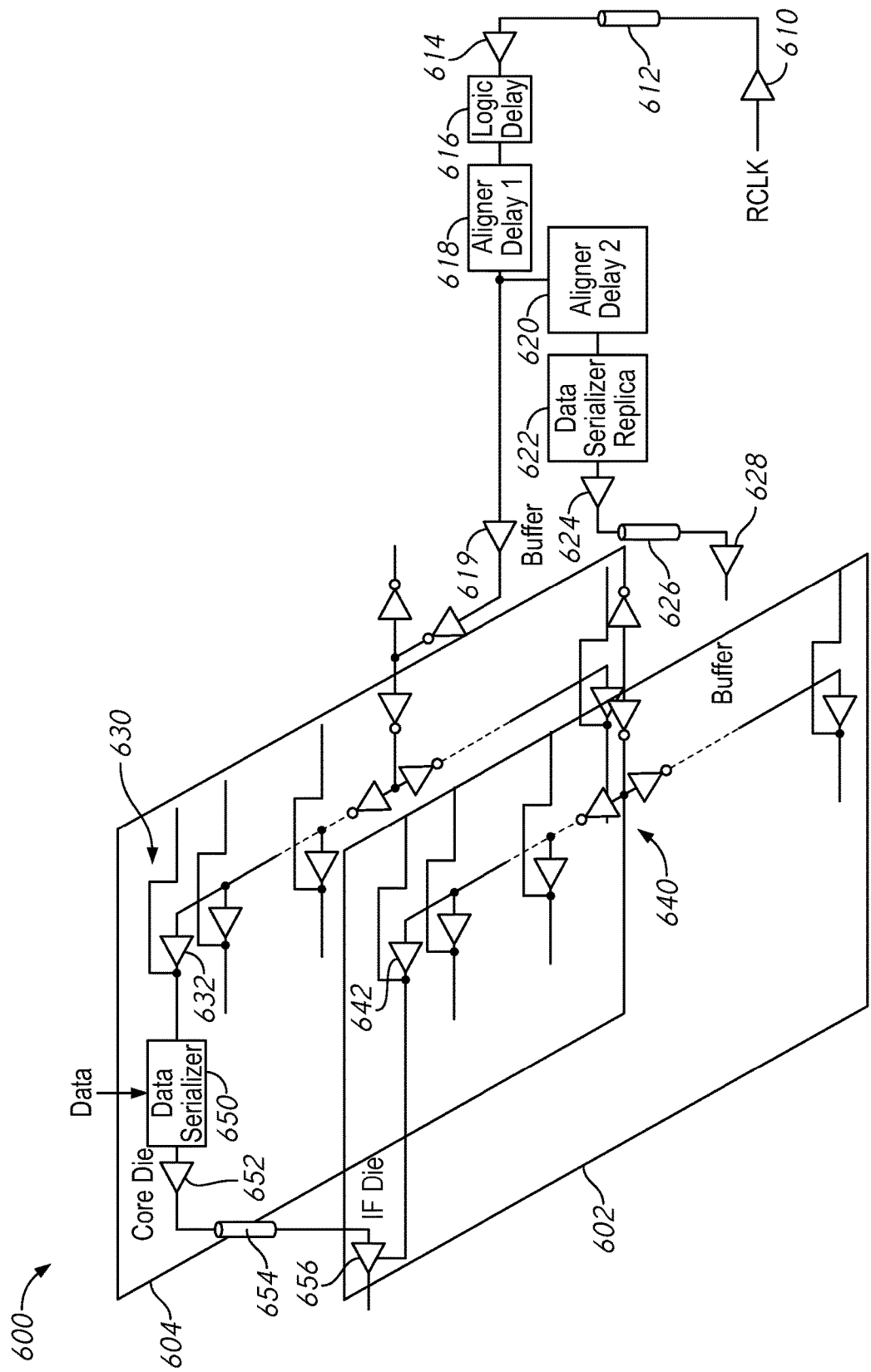
FIG. 6 is a schematic diagram of a native read path according to some embodiments of the present disclosure.

FIG. 6 is a schematic diagram of a native read path according to some embodiments of the present disclosure. The read path 600 may, in some embodiments, represent an example implementation of the clock tree 410 and 457 of FIG. 4. The read path 600 shows a clock tree 630 in the core die (e.g., 457 of FIG. 4) and a clock tree 640 in the interface die 602. (e.g., 422 of FIG. 4). The clock tree 630 is used to distribute the read clock RCLK in the core die 604 while the clock tree 640 distributes the delayed read clock RRCLK to the output circuit 636. The two clock trees 630 and 640 may have substantially the same shape (e.g., a same or substantially similar circuit configuration), such that they have a similar timing delay.

The read clock RCLK is provided by an output buffer 610 of the interface die 602 through a TSV 612 to the core die 604. An input buffer 614 receives the read clock RCLK and provides it through a logic delay 616 to a first aligner delay circuit 618 (e.g., 462 of FIG. 4). The first aligner delay circuit 618 provides a delayed clock through a buffer 619 to the clock tree 630. The clock tree 630 distributes the clock signal RCLK to different data serializers 650. The clock tree 630 includes a number of such as 632, which provide the clock signal to destinations such as example data serializer 650. The serializer 650 provides data with timing based on the read clock RCLK and the data is provided through TSV 654 to the output circuit 656 in the interface die 602.

Along the return clock path, the aligner delay 618 also provides the clock to the second aligner delay 620, which provides a delayed read clock to data serializer replica 622 and to an output buffer 624. The output buffer 624 provides the returning read clock RRCLK through a TSV 626 to an input buffer 628 of the interface die 602. The input buffer 628 provides the RRCLK to a clock tree 640. The clock tree 640 includes a number of buffers, such as 642, which provide the clock signal to destinations such as example output circuit 656.

Figure 7:
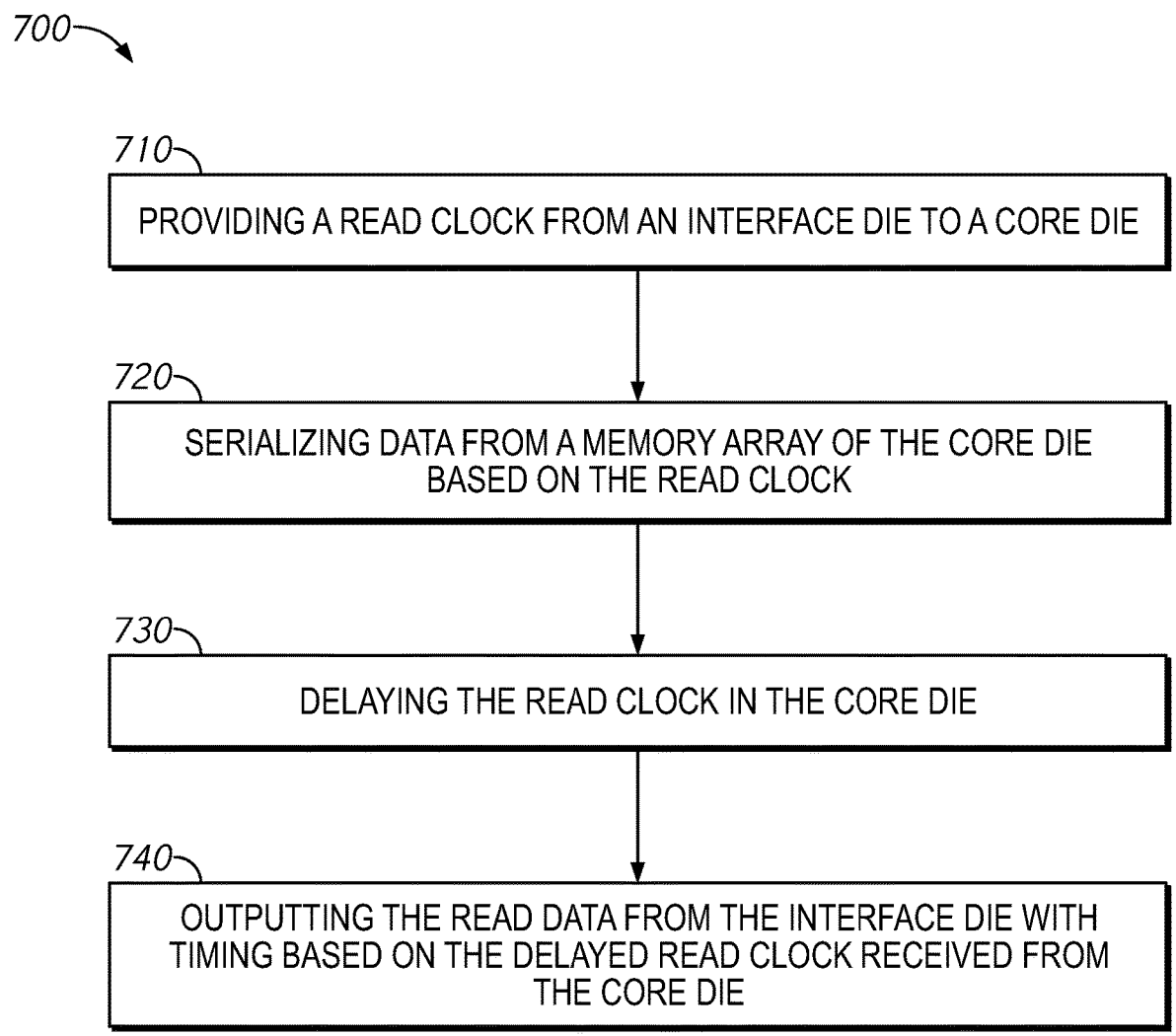
FIG. 7 is a block diagram of a method according to some embodiments of the present disclosure.

FIG. 7 is a block diagram of a method according to some embodiments of the present disclosure. The method 700 may, in some embodiments, be implemented by one or more of the apparatuses or systems shown in FIGS. 1-6.

The method 700 includes box 710, which describes providing a read clock from an interface die to a core die. For example, a buffer (e.g., 407 of FIG. 4) in the interface die may provide a read clock along a first TSV to the core die. The core die may be one of a number of core die stacked on the interface die.

The method 700 includes box 720, which describes serializing data from a memory array of the core die based on the read clock. The core die may include a first delay circuit (e.g., 454 of FIG. 4) which may delay the read clock before providing the clock to the data to the serializer along a data path. The serializer provides the serialized data along a TSV back to the interface die.

The method 700 includes box 730, which describes delaying the read clock in the core die. The core die includes a delay circuit (e.g., 462) along a clock return path which delays the read clock by an adjustable amount to produce a delayed read clock. The delayed clock signal may be provided along a third TSV to the interface die. The method 700 may include measuring an alignment of an oscillator signal along a replica path and setting an amount of the delay based on the measured alignment. For example a phase detector (e.g., 424 of FIG. 4) may measure the alignment and provide a signal to a aligner control circuit (e.g., 490 of FIG. 4) which sets the amount of delay.

The method 700 includes box 740, which describes outputting the read data from the interface die with timing based on the delayed read clock received from the core die. For example an output circuit (e.g., 440 of FIG. 4) receives the data from the core die and receives the delayed clock signal from the core die and provides the output data with timing based on the delayed clock signal.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
   an interface die configured to provide a read clock; and
   a core die stacked on the interface die, the core die comprising:
   a delay circuit configured to receive the read clock and provide a delayed read clock;
   a serializer configured to provide data with timing based on the read clock; and
   a data serializer replica circuit configured to receive the delayed read clock and provide the delayed read clock to the interface die;
   wherein the interface die further comprises an output circuit configured to provide the read data with timing based on the delayed read clock from the interface die.

2. The apparatus of claim 1, wherein the core die comprises a first clock tree configured to distribute the delayed read clock to the serializer, and wherein the interface die comprises a second clock tree configured to distribute the delayed read clock to the output circuit.

3. The apparatus of claim 2, wherein the first clock tree and the second clock tree have substantially the same circuit configuration.

4. An apparatus, comprising:
an interface die configured to provide a read clock and an oscillator signal; and
a core die stacked on the interface die, the core die comprising:
   a delay circuit configured to receive the read clock and provide a delayed read clock;
   a serializer configured to provide data with timing based on the read clock;
   a second delay circuit configured to receive the oscillator signal and provide a delayed oscillator signal; and
   a replica serializer configured to provide data with timing based on the oscillator signal,
wherein the interface die further comprises an output circuit configured to provide the read data with timing based on the delayed read clock from the interface die and a phase detector configured to provide a measured phase signal based on the data and the delayed oscillator signal from the interface die, and
wherein the core die further comprises an aligner control circuit configured to set a delay of the delay circuit based on the measured phase signal.

5. The apparatus of claim 1, wherein the delay circuit is a coarse and fine adjustable delay circuit.

6. The apparatus of claim 1, further comprising a second delay circuit configured to receive the read clock, delay the read clock by a configurable amount, and provide the read clock to delay circuit and the serializer.

7. An apparatus comprising:
a plurality of core dice;
an interface die configured to provide a read clock to the plurality of core dice and configured to receive a delayed read clock from a selected one of the plurality of core dice, the interface die comprising an output circuit configured to provide data received from the selected one of the plurality of core dice with timing based on the delayed read clock, wherein the selected one of the plurality of core dice comprises a delay circuit configured to receive the read clock and provide the delayed read clock, a serializer configured to provide the data with timing based on the read clock, and a data serializer replica circuit configured to receive the delayed read clock and provide the delayed read clock to the interface die.

8. The apparatus of claim 7, wherein the output circuit provides the data to an output terminal of the interface die.

9. The apparatus of claim 7, further comprising:
a first through silicon via (TSV) configured to provide the read clock from the interface die to the plurality of core dice;
a second TSV configured to provide the data from the plurality of core dice to the interface ide; and
a third TSV configured to provide the delayed read clock from the plurality of core dice to the interface die.

10. The apparatus of claim 7, wherein each of the plurality of core dice includes a delay circuit configured to provide an adjustable amount of delay between the read clock and the delayed read clock.

11. The apparatus of claim 10, wherein each of the plurality of core dice includes an aligner control circuit configured to set the amount of delay in that one of the plurality of core dice.

12. The apparatus of claim 7, wherein each of the plurality of core dice includes a respective clock tree configured to distribute the read clock to a respective data serializer configured to provide the data with timing based on the read clock.

13. The apparatus of claim 7, further comprising a data path configured to provide the data from the selected one of the plurality of core dice to the interface die and a return clock path configured to provide the delayed clock signal from the selected one of the plurality of core dice to the interface die.

14. A method comprising:
providing a read clock from an interface die to a core die;
serializing data from a memory array of the core die with timing based on the read clock;
delaying the read clock in the core die;
measuring an alignment of an oscillator signal along a replica path;
adjusting the delay time based on the measured delay; and
outputting the read data from the interface die with timing based on the delayed read clock received from the core die.

15. The method of claim 14, further comprising adjusting a delay time between the delayed read clock and the read clock.

16. The method of claim 14, further comprising delaying the read clock with a first delay circuit and a second delay circuit in the core die.

17. The method of claim 14, further comprising adjusting a delay of the first delay circuit and a delay of the second delay circuit.

18. The method of claim 14, further comprising:
providing the read clock along a first TSV from the interface die to the core die;
receiving the delayed read clock along a second TSV from the core die to the interface die; and
receiving the read data along a third TSV from the core die to the interface die.

* * * * *